United States Patent
Daniel et al.

(12) 
(10) Patent No.: US 6,235,590 B1
(45) Date of Patent: May 22, 2001

(54) FABRICATION OF DIFFERENTIAL GATE OXIDE THICKNESSES ON A SINGLE INTEGRATED CIRCUIT CHIP

(75) Inventors: David W. Daniel, Divide; Dianne G. Pinello, Woodland Park, both of CO (US); Michael F. Chisholm, Garland, TX (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/216,394

(22) Filed: Dec. 18, 1998

(51) Int. Cl.$^7$ ................................................ H01L 21/8234
(52) U.S. Cl. .......................... 438/275; 438/769; 438/775; 438/776
(58) Field of Search .................................. 438/275, 287, 438/769, 775, 776; 257/410, 411

(56) References Cited

U.S. PATENT DOCUMENTS

| | | | |
|---|---|---|---|
| 4,240,092 | 12/1980 | Kuo | 357/41 |
| 5,012,315 | 4/1991 | Shur | 357/23.14 |
| 5,316,965 | 5/1994 | Philipossian et al. | 437/70 |
| 5,444,279 | 8/1995 | Lee | 257/316 |
| 5,464,792 | 11/1995 | Tseng et al. | 437/160 |
| 5,497,021 | 3/1996 | Tada | 257/369 |
| 5,498,577 | 3/1996 | Fulford, Jr. et al. | 437/228 |
| 5,510,278 | 4/1996 | Nguyen et al. | 437/40 |
| 5,516,707 | 5/1996 | Loh et al. | 437/24 |
| 5,552,332 | 9/1996 | Tseng et al. | 437/41 |
| 5,596,218 | 1/1997 | Soleimani et al. | 257/369 |
| 5,610,084 | 3/1997 | Solo de Zaldivar | 437/24 |
| 5,633,523 | 5/1997 | Kato | 257/369 |
| 5,674,788 | 10/1997 | Wristers et al. | 437/239 |
| 5,716,863 | 2/1998 | Arai | 437/41 |
| 5,750,435 | 5/1998 | Pan | 438/525 |
| 5,783,469 | 7/1998 | Gardner et al. | 438/199 |
| 6,037,201 | * 3/2000 | Tsai et al. | 438/197 |

OTHER PUBLICATIONS

D. Lee et al., Reliability of Nitrided Si–SiO$_2$ Interfaces Formed by a New, Low Temperature, Remote–Plasma Process; J. Vac. Sci. Tech., pp. 1788–1793; Jul.–Aug., 1995.

C.G. Parker et al.; Ultrathin Oxide–Nitride Gate Dielectric MOSFET's, IEEE Electron Device Letters, vol. 19, No. 4, pp. 106–108; Apr., 1998.

IBM Technical Disclosure Bulletin, vol. 19, No. 3, Aug. 1976; Formation of Thick Si$_3$N$_4$ or Si$_x$O$_y$N$_z$ on SI Substrate by Anodnitridization; M.R. Poponiak et al.

GaSonics International; The Strategic Solution Advanced High Pressure Thermal Processing; http://www.gasonics.com/frames/prod/vhp.htm (Oct. 23, 1998).

* cited by examiner

*Primary Examiner*—Sara Crane

(57) ABSTRACT

Techniques for fabricating integrated circuits having devices with gate oxides having different thicknesses and a high nitrogen content include forming the gate oxides at pressures at least as high as 2.0 atmospheres in an ambient of a nitrogen-containing gas. In one implementation, a substrate includes a first region for forming a first device having a gate oxide of a first thickness and a second region for forming a second device having a gate oxide of a second different thickness. A first oxynitride layer is formed on the first and second regions in an ambient comprising a nitrogen-containing gas at a pressure in a range of about 10 to about 15 atmospheres. A portion of the first oxynitride layer is removed to expose a surface of the substrate on the second region. Subsequently, a second oxynitride is formed over the first and second regions in an ambient comprising a nitrogen-containing gas at a pressure in a range of about 10 to about 15 atmospheres to form the first and second gate oxides. Respective gate electrodes are formed over the first and second gate oxides. The oxynitride gates can have a nitrogen content in a range of about 0.2 to about 2.0 percent which can prevent the diffusion of boron ions from the gate electrodes into the oxynitride gates, thereby improving device characteristics. The oxynitride gates of different thicknesses are suitable for high and low voltage devices on the same integrated circuit.

14 Claims, 5 Drawing Sheets

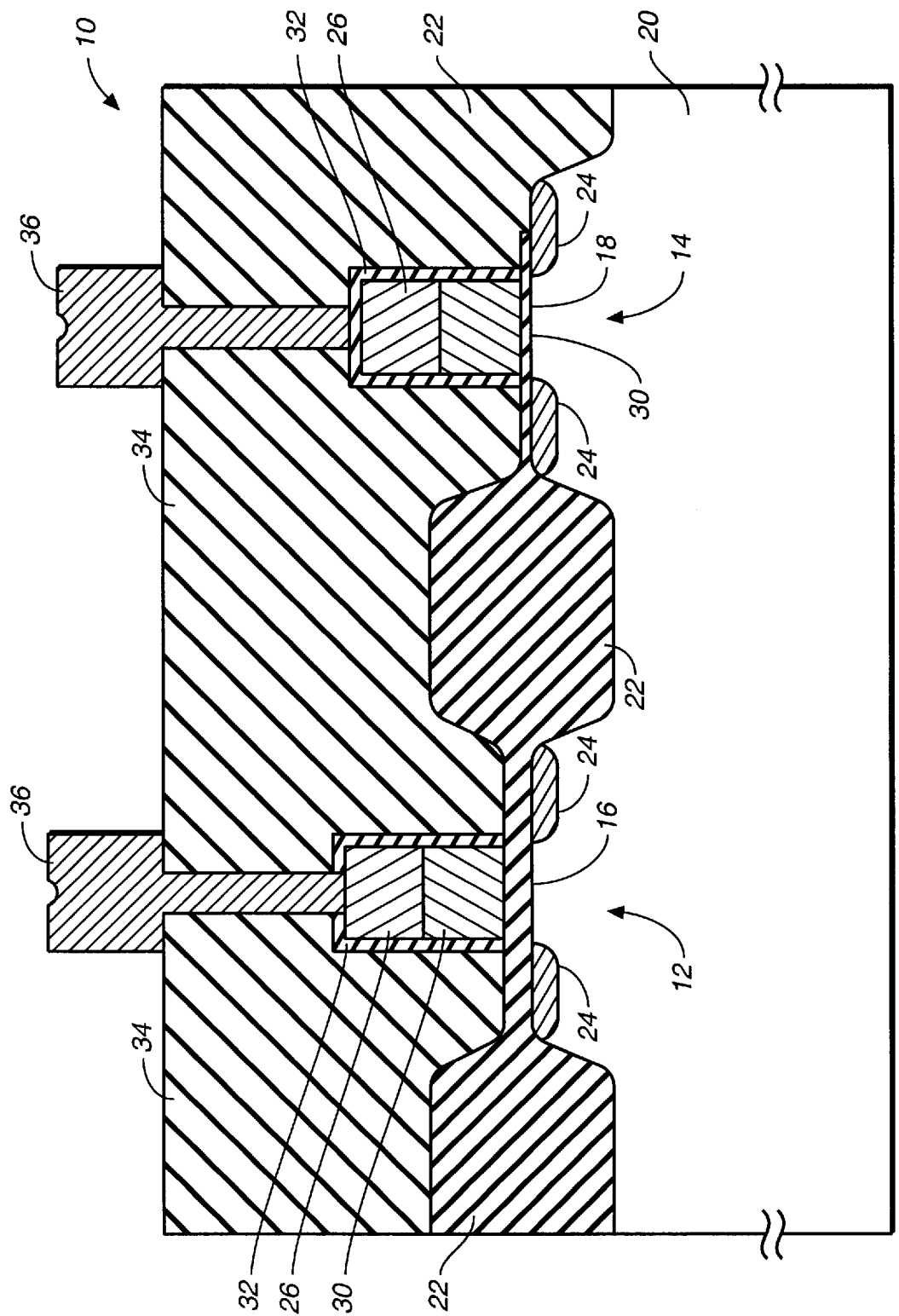
FIG._1

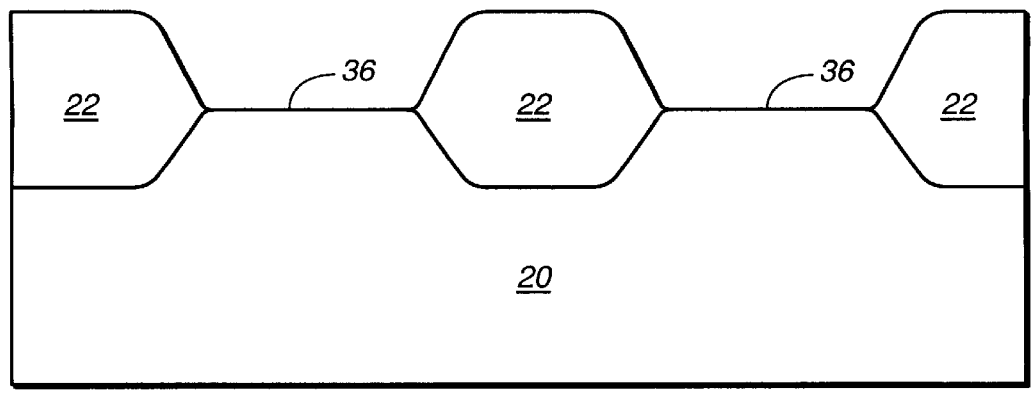
FIG._2A
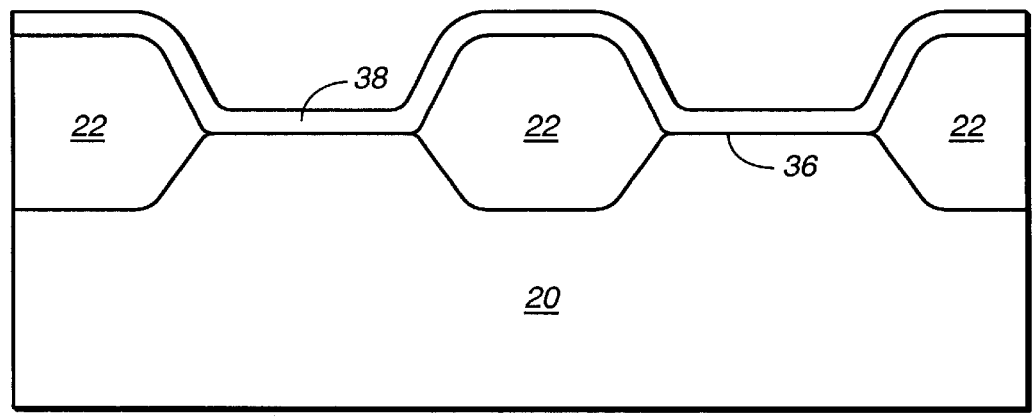
FIG._2B
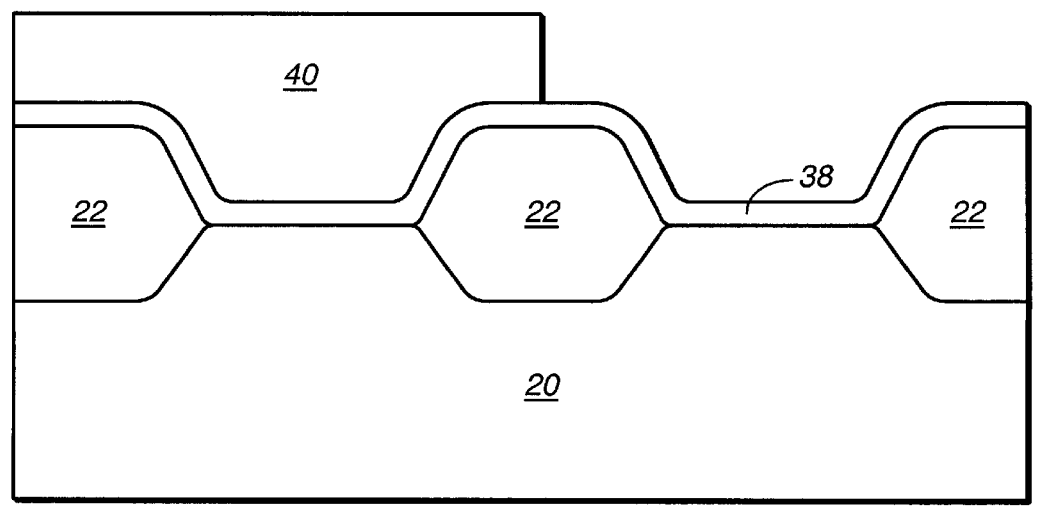
FIG._2C

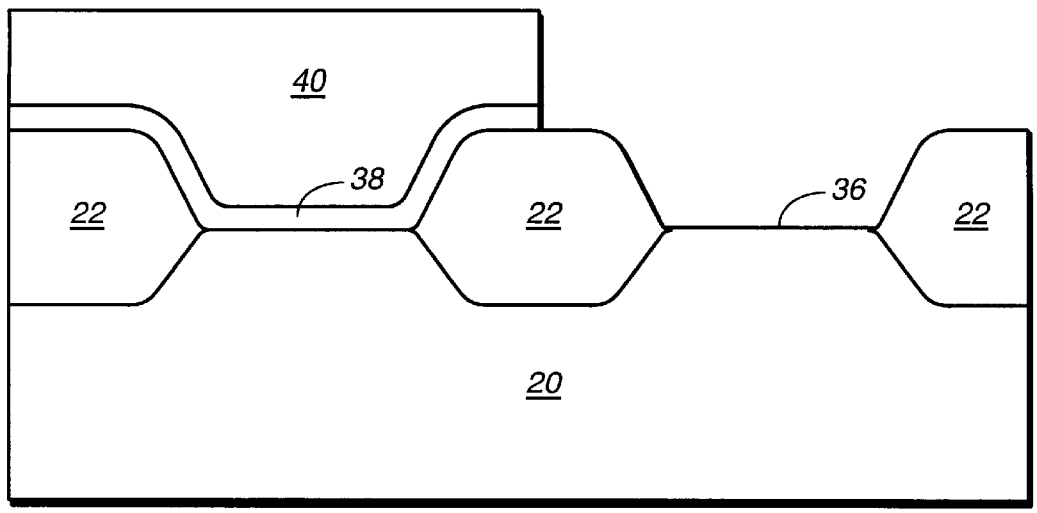
FIG._2D
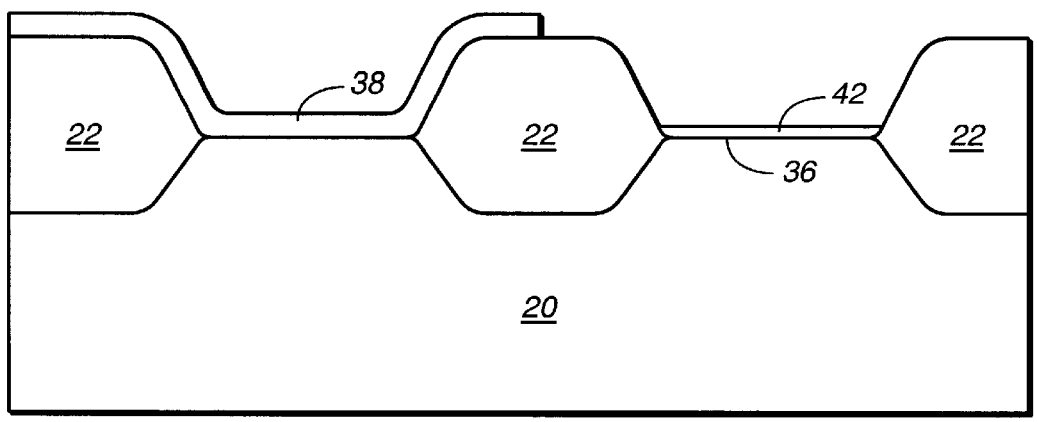
FIG._2E
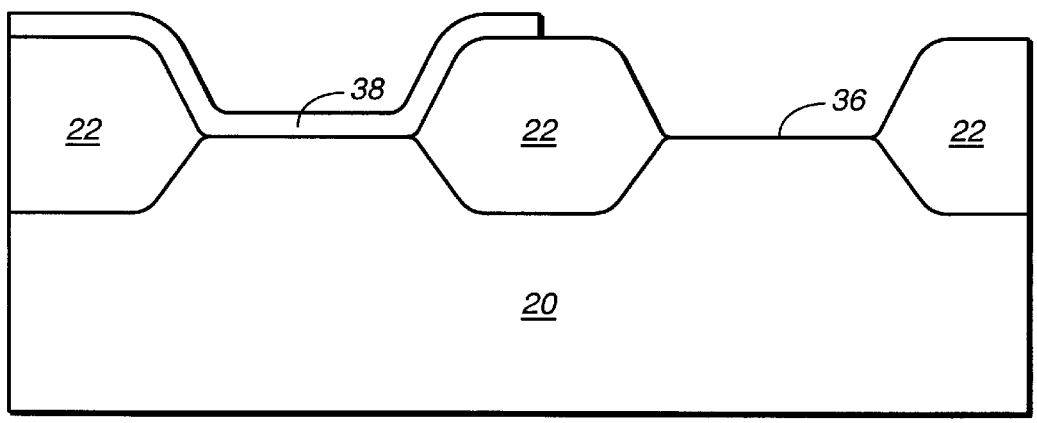
FIG._2F

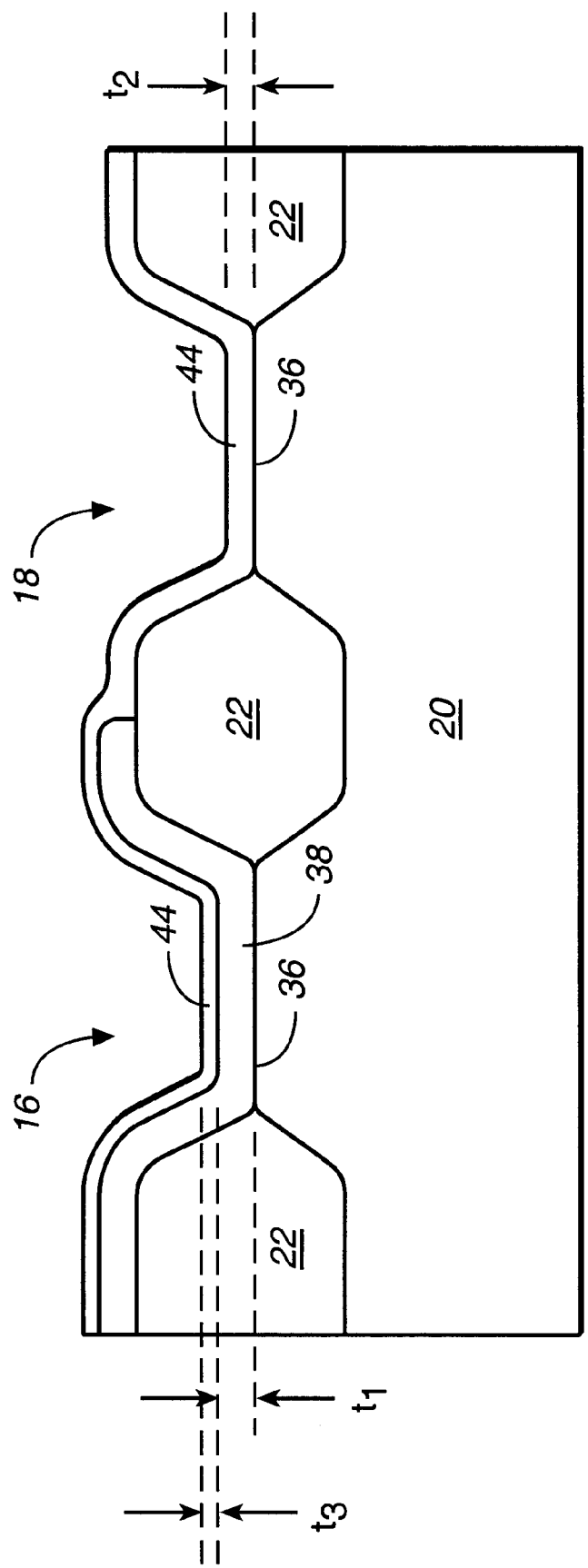
FIG._2G

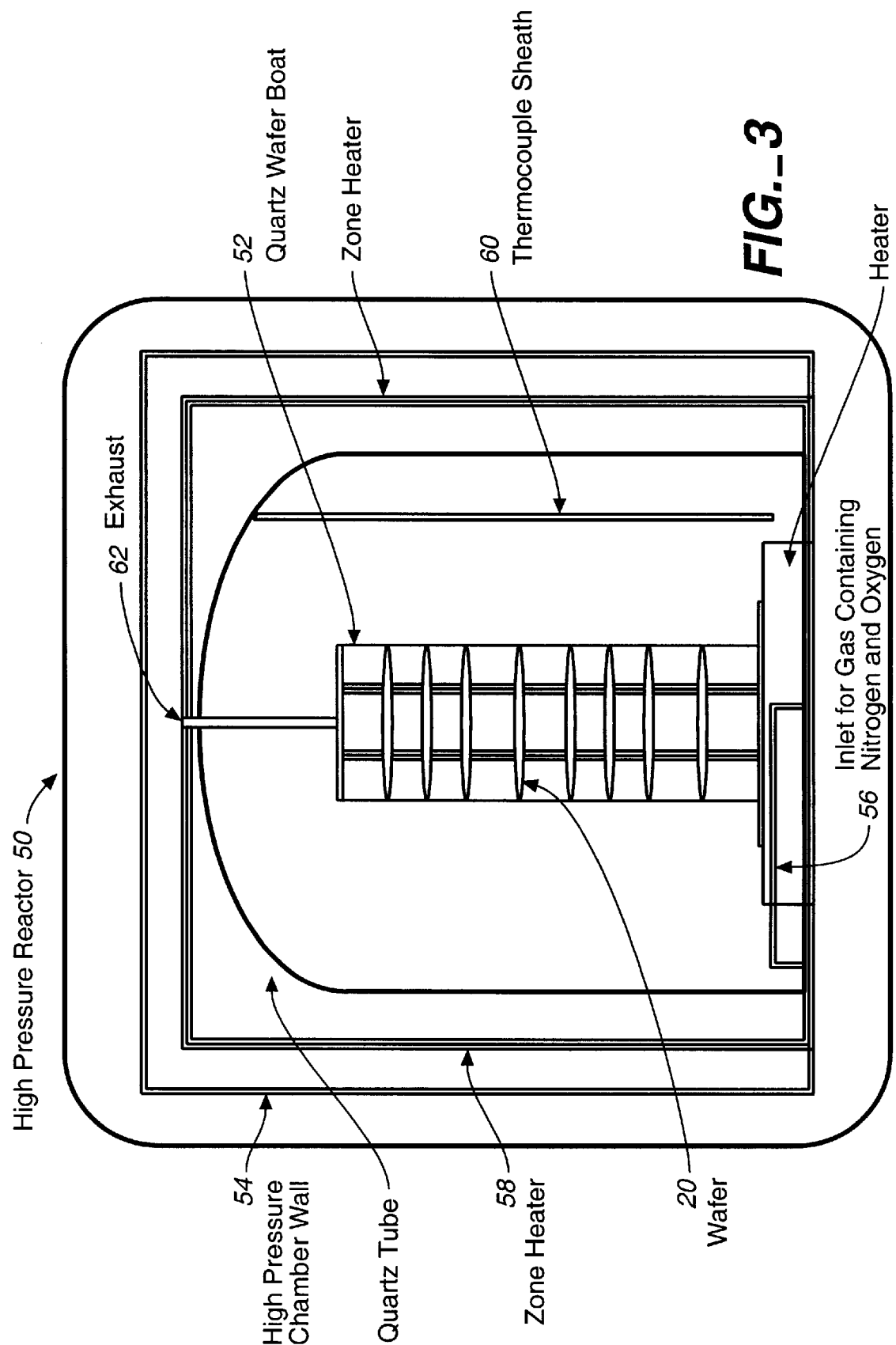

FABRICATION OF DIFFERENTIAL GATE OXIDE THICKNESSES ON A SINGLE INTEGRATED CIRCUIT CHIP

BACKGROUND

The present invention relates generally to the fabrication of integrated circuits and, in particular, to techniques for fabricating integrated circuits incorporating insulating layers such as gate oxides having different thicknesses.

Integrated circuits incorporating active elements such as metal-oxide-semiconductor (MOS) devices that are operated from multiple power supplies are being developed for various applications. Examples of such integrated circuits include dual gate CMOS circuits, peripheral circuits for non-volatile memory and circuits for driving liquid crystal flat panel displays, among others. Such circuits can include active elements that require a high supply voltage and other elements for which a low supply voltage is sufficient. In general, a high supply voltage may be required for high performance, high speed circuit elements, whereas a low supply voltage may be sufficient for low speed circuit elements on the same integrated circuit chip. For example, in some applications, a high supply voltage of 5 volts (V) can be used with a corresponding low supply voltage of 3.3 V.

Typically, MOS devices or other circuit elements that are to be operated from the high supply voltage are formed so that their gate oxide is relatively thick. Conversely, circuit elements that are to be operated from the low supply voltage are formed with a relatively thin gate oxide.

Although various techniques have been employed in the formation of the different oxide layers, a fabrication process which results in an integrated circuit having multiple gate oxides of different thicknesses as well as with improved electrical properties is desirable.

SUMMARY

In general, in one aspect, techniques are disclosed for fabricating an integrated circuit including devices having gate oxides with different thicknesses and a high nitrogen content. The techniques include forming the gate oxides at pressures at least as high as 2.0 atmospheres in an ambient of a nitrogen-containing gas. The device with the thicker oxynitride layer is suitable for operation with a relatively high voltage, whereas the device with the thinner oxynitride layer is suitable for operation with a relatively low voltage.

In one implementation, a semiconductor substrate includes a first region for forming a first device having a gate oxide of a first thickness and a second region for forming a second device having a gate oxide of a second different thickness. A first oxynitride layer is formed on the first and second regions in an ambient comprising a nitrogen-containing gas at a pressure in a range of about 10 to about 15 atmospheres. A portion of the first oxynitride layer is removed to expose a surface of the substrate on the second region. Subsequently, a second oxynitride is formed over the first and second regions in an ambient comprising a nitrogen-containing gas at a pressure in a range of about 10 to about 15 atmospheres to form the first and second gate oxides. Respective gate electrodes are formed over the first and second gate oxides.

In another aspect, a method of fabricating an integrated circuit includes forming a first oxynitride layer on a surface of a substrate in an ambient comprising a nitrogen-containing gas at a pressure of a least 2.0 atmospheres. A portion of the first oxynitride layer is etched to expose a portion of the substrate surface. Subsequently, a second oxynitride is formed over the surface of the semiconductor in an ambient comprising a nitrogen-containing gas at a pressure of a least 2.0 atmospheres. The second oxynitride layer overlaps at least a portion of the first oxynitride to form a combined first insulating layer of a first thickness. A portion of the second oxynitride layer is formed on the semiconductor surface to form a second insulating layer having a second thickness less than the first thickness.

In yet a further aspect, an integrated circuit includes a substrate and first and second MOS devices formed on the substrate. Each MOS device includes drain and source regions formed in the substrate, an oxynitride gate having a nitrogen content in the range of about 0.2 to about 2.0 percent or a nitrogen content of at least $1.0 \times 10^{21}$ atoms/cm$^3$, and a gate electrode formed on the oxynitride gate. The oxynitride gate of the first MOS device has a thickness greater than the thickness of the oxynitride gate of the second MOS device. For example, the thickness of the oxynitride gate of the first MOS device can be at least 1.25 times the thickness of the oxynitride gate of the second MOS device.

Various implementations include one or more of the following advantages. An integrated circuit having multiple gate oxides with different thicknesses can be fabricated. The different oxide thicknesses can be used, for example, in the fabrication of devices formed on a single wafer and requiring different operating voltages. Additionally, the invention allows gate oxides having different thicknesses and with a relatively high nitrogen content to be formed. The high nitrogen content can help prevent the diffusion of boron ions from the gate electrodes into the oxynitride gates, thereby improving device characteristics. For example, the high nitrogen concentration can give the devices a higher voltage tolerance and make them more resistant to breakdown. The device performance and lifetime of dual gate CMOS and circuits can, thereby be improved. Formation of the gate oxides in a high pressure furnace also can result in a more uniform distribution of nitrogen throughout the gate oxide which also improves performance of the devices.

Other features and advantages will be readily apparent from the following detailed description, the accompanying drawings and the claims.

BRIEF DESCRIPTION OF THE DRAWINGS

FIG. 1 illustrates an exemplary partially-fabricated device fabricated according to the invention.

FIGS. 2A through 2G illustrate various steps in the fabrication of the device of FIG. 1.

FIG. 3 illustrates an exemplary high pressure system in which the gate oxides of the device of FIG. 1 can be fabricated.

DETAILED DESCRIPTION

Referring to FIG. 1, a portion of an exemplary integrated circuit 10 includes multiple MOS field effect transistors (FETs) 12, 14. One MOSFET 12 has a relatively thick gate insulating layer 16 and is operated at a relatively high voltage, for example, 5 volts. Another MOSFET 14 has a relatively thin gate insulating layer 18 and is operated at a relatively low voltage, for example, 3.3 volts. In other implementations, the high and low voltages are different from those values. For example, the high voltage can be 3.3 volts, and the low voltage can be 2.5 volts or 1.8 volts.

Still referring to FIG. 1, the integrated circuit 10 includes isolation regions 22 formed on a p-type silicon or other semiconductor substrate 20. Ions may be implanted into the substrate to control threshold voltages.

Poly-crystalline silicon (poly-Si) gate electrodes 30 are provided over each of the gate insulating layers 16, 18. A post oxide layer 32 can be provided over the gate electrodes 30 or as spacers along the sides of the gate electrodes. Each of the MOSFETs 12, 14 also includes respective p-type boron ion-implanted source and drain regions 24. The upper surface of each poly-Si gate electrode 30 includes a boron ion-implanted region 26.

The surface of the substrate 20 is covered with a layer of boro-phospho silicate glass (BPSG) 34 and serves as a passivation layer to seal out moisture and contaminants. Conductive contacts 36 are formed through the BPSG layer 34.

Further details of a process for fabricating the gate insulating layers 16, 18 are described with respect to FIGS. 2A though 2G. As illustrated in FIG. 2A, the isolation regions 22 are formed on the surface of the substrate 20 using a standard technique, for example, by localized oxidation of the silicon. Prior to forming the gate insulating layers 16, 18, the surface 36 of the substrate 20 between the isolation regions 22 is cleaned to remove any residual oxide as well as surface contaminants. Silicon oxide can be removed, for example, using ammonium fluoride ($NH_4F$). The surface 36 also is cleaned using standard SC1 and SC2 techniques. Finally, the surface 36 of the substrate is cleaned with hydrogen fluoride (HF).

Referring to FIG. 2B, a first silicon oxynitride layer 38 is grown thermally over the upper surface 36 of the substrate 20. The oxynitride layer 38 is grown under elevated temperature and pressure in an ambient containing nitrogen. More specifically, the oxynitride layer 38 is grown by placing the silicon wafer 20 in a quartz wafer boat 52 and inserting the wafer boat into an oxidation furnace or reactor 50 with a high-pressure chamber 54 (FIG. 3). The reactor 50 includes an inlet 56 for introducing a gas containing nitrogen and oxygen, such as nitrous oxide ($N_2O$), nitric oxide (NO) or a combination of both $N_2O$ and NO. A zone heater 58 heats the ambient gas in the reactor 50, and a thermocouple, housed in a quartz sheath 60, is used to monitor the temperature along the length of the reactor. An exhaust outlet 62 is provided for removing the reactant gases from the reactor 50. A Vertical High Pressure thermal reactor, commercially available from GaSonics International of San Jose, Calif., is suitable for use as the reactor 50.

The oxynitride layer 38 can be grown, for example, at temperatures between about 650 and about 900 degrees celsius (° C.) and at pressures between about 2 and about 25 atmospheres. Preferably, the pressure in the chamber 54 is in the range of about 10 to about 15 atmospheres. In general, the higher the pressure, the higher the nitrogen content of the oxynitride layer. In some implementations, the nitrogen content of the oxynitride layer 38 is in the range of about 0.2 to about 2.0 percent. Preferably, the concentration of nitrogen atoms near the upper surface of the oxynitride layer 38 is at least $1.0 \times 10^{21}$ atoms/$cm^3$.

Once the first oxynitride layer 38 is grown, a photoresist pattern 40 is formed over the first oxynitride layer 38 (FIG. 2C). The photoresist pattern 40 covers the portion of the oxide layer which will form the gate oxide for the high voltage device 12 with the thick gate oxide 16. The portion of the first oxynitride layer 38 that was grown over the area of the substrate 20 where the low voltage device 14 is to be formed is etched down to the surface 36 of the silicon substrate 20 (FIG. 2D). A buffered oxide etch can be used to remove that portion of the first oxynitride layer 38.

Next, referring to FIG. 2E, the photoresist 40 is stripped or removed using, for example, a solution containing sulfuric peroxide. As the photoresist 40 is stripped, a thin chemical oxide layer 42 may grow on the surface 36 of the substrate from which the first oxynitride layer 38 was previously removed (FIG. 2E). The surface 36 of the substrate is cleaned to remove the chemical oxide layer 42 (FIG. 2F) using standard SC1 and SC2 techniques followed by a diluted HF solution. The surface 36 of the substrate can be cleaned either in a vessel dedicated for that purpose or in the same vessel used for the previous etches of the first oxynitride layer 38 and the photoresist pattern 40. Preferably, only about 3–4 angstroms (A) are removed from the remaining first oxynitride layer 38 during this substrate surface cleaning process.

Once the surface 36 of the substrate has been cleaned in the area where the thin gate oxide device 14 is to be formed, a second silicon oxynitride layer 44 is grown thermally over the substrate 20 (FIG. 2G). The second oxynitride layer 44 is grown over the surface 36 of the substrate where the low voltage device 14 is to be formed, as well as over the first oxynitride layer 38. The combined thicknesses of the first and second oxynitride layers 38, 44 which form the gate oxide 16 of the high voltage device 12 is greater than the thickness of the second oxynitride layer 44 alone which forms the gate oxide 18 of the low voltage device 18.

The second oxynitride layer 44 also is grown in under elevated temperature and pressure in an ambient containing nitrogen. Thus, the second oxynitride layer 44 can be grown in the oxidation furnace 50. The conditions such as temperature and pressure for growing the second oxynitride layer 44 can be in the same ranges as those discussed above with respect to the first oxynitride layer 38. However, the rate of growth of the second oxynitride layer 44 on the bare silicon surface 36 tends to be greater than the rate of growth of the second oxynitride layer on the first oxynitride layer 38. Thus, the respective durations for which the wafer is placed in the furnace 50 during growth of the first and second oxynitride layers depend upon both the desired final thicknesses of the gate oxides 16, 18 as well as their relative thicknesses.

In one experiment, a first oxynitride layer was grown in a GaSonics International Vertical High Pressure thermal reactor at a temperature of about 800° C. and a pressure in the range of 10–15 atmospheres. A gas containing a mixture of NO and $N_2O$ flowed into the high pressure chamber, with the ratio of NO gas to $N_2O$ gas at about 1:9. The first oxynitride layer 38 had a thickness $t_1$ of about fifty-five Å. A second oxynitride layer was grown under similar conditions and had a thickness $t_2$ of about fifty-five Å on the surface of the substrate. However, the thickness $t_3$ of the second oxynitride layer formed on the second oxynitride layer was only about fifteen Å. Thus, the combined thicknesses ($t_1 + t_3$) of the first and second oxynitride layers forming the thick gate oxide was about seventy Å. Thus, in some implementations, the thickness of the oxynitride gate of the first MOS device is at least 1.25 times the thickness of the oxynitride gate of the second MOS device.

In another experiment, a first oxynitride layer was grown in a GaSonics International Vertical High Pressure thermal reactor at a temperature of about 800° C. and a pressure in the range of 10–15 atmospheres. The first oxynitride layer had a thickness $t_1$ of about thirty-three Å. A gas containing a mixture of NO and $N_2O$ flowed into the high pressure chamber, with the ratio of NO gas to $N_2O$ gas at about 1:9. A second oxynitride layer was grown under similar conditions and had a thickness $t_2$ of about thirty-three Å on the surface of the substrate. However, the thickness $t_3$ of the second oxynitride layer formed on the second oxynitride layer was only about twelve Å. Thus, the combined thicknesses ($t_1+t_3$) of the first and second oxynitride layers forming the thick gate oxide was about forty-five Å. Thus, the thickness of the oxynitride gate of the first MOS device can be as high as 1.33 times the thickness of the oxynitride gate of the second MOS device. In other implementations, different thicknesses $t_1$, $t_2$ and $t_3$ can be obtained.

Other layers of the integrated circuit 10 can be formed by conventional techniques. For example, a poly-Si layer can be deposited over the oxynitride gates by a chemical vapor deposition (CVD) process. The poly-Si layer then is etched selectively to form the poly-Si gate electrodes 30. The poly-Si layer can be patterned by masking the gate structures with photoresist according to known techniques.

The wafer is subjected to a low concentration of p-type boron ions by ion implantation or diffusion to form the source and drain regions 24. A lightly doped boron region also is formed in the upper portions 26 of the poly-Si gate electrodes 30.

The oxide layer 32 is formed using a CVD process followed by a directional dry etch process. The wafer then is subjected to a high concentration of p-type boron ions by ion implantation or diffusion to form the heavily-doped source and drain regions 24. Boron ions also penetrate the poly-Si gate electrodes 30 forming the heavily-doped regions 26. The surface of the wafer is covered with the passivation layer 34 which is selectively etched to form the conductive contacts 36.

The foregoing technique allows the formation of an integrated circuit having multiple gate oxides with different thicknesses. As previously indicated, the different oxide thicknesses can be used for devices formed on a single wafer and requiring different operating voltages.

Additionally, the foregoing technique allows gate oxides with a relatively high nitrogen content to be formed. The high nitrogen concentration can give the devices 12, 14 a higher voltage tolerance and make them more resistant to breakdown. In particular, the high nitrogen content can reduce or prevent the diffusion of boron ions from the poly-Si gate electrodes 30 into the gate oxides 16, 18 during subsequent thermal annealing processes. The device performance and lifetime can, thereby be improved. Formation of the gate oxides 16, 18 in a high pressure furnace also can result in a more uniform distribution of nitrogen throughout the gate oxide which also improves performance of the devices.

Other implementations are within the scope of the following claims.

What is claimed is:

1. A method of fabricating an integrated circuit, the method comprising:

forming a first oxynitride layer on a surface of a substrate in an ambient comprising a nitrogen-containing gas at a pressure of a least 2.0 atmospheres;

etching a portion of the first oxynitride layer to expose a portion of the substrate surface; and subsequently forming a second oxynitride over the surface of the semiconductor in an ambient comprising a nitrogen-containing gas at a pressure of a least 2.0 atmospheres, wherein the second oxynitride layer overlaps at least a portion of the first oxynitride to form a combined first insulating layer of a first thickness, and wherein a portion of the second oxynitride layer is formed on the semiconductor surface to form a second insulating layer having a second thickness less than the first thickness.

2. The method of claim 1 further including:

forming isolation regions separating regions of the substrate on which the first and second insulating layers are formed.

3. The method of claim 2 wherein the first and second insulating layers serve as respective gate oxides for high voltage and low voltage devices.

4. The method of claim 1 wherein etching a portion of the first oxynitride layer includes performing a buffered oxide etch.

5. The method of claim 1 wherein the first and second oxynitride layers are formed at a pressure in a range of about 10 to about 15 atmospheres.

6. The method of claim 5 wherein the first and second oxynitride layers are formed at a temperature in a range of about 650 to about 900 degrees celsius.

7. The method of claim 1 wherein forming the first and second oxynitride layers includes providing a gas containing at least one of nitrous oxide or nitric oxide.

8. A method of fabricating an integrated circuit comprising a plurality of devices each of which includes a gate oxide, the method comprising:

providing a substrate including a first region for forming a first device having a gate oxide of a first thickness and a second region for forming a second device having a gate oxide of a second different thickness;

forming a first oxynitride layer on the first and second regions in an ambient comprising a nitrogen-containing gas at a pressure in a range of about 10 to about 15 atmospheres;

removing a portion of the first oxynitride layer to expose a surface of the substrate on the second region;

subsequently forming a second oxynitride over the first and second regions in an ambient comprising a nitrogen-containing gas at a pressure in a range of about 10 to about 15 atmospheres to form the first and second gate oxides; and forming respective gate electrodes over the first and second gate oxides.

9. The method of claim 8 wherein forming the first and second oxynitride layers includes providing a gas containing at least one of nitrous oxide or nitric oxide.

10. The method of claim 9 wherein the nitrogen content of the first and second oxynitride layers is in a range of about 0.2 to about 2.0 percent.

11. The method of claim 10 further including subjecting the substrate to boron ions.

12. The method of claim 11 wherein boron ions penetrate the gate electrodes when the substrate is subjected to the boron ions.

13. The method of claim 8 further including:

applying a first voltage to the gate electrode over the gate oxide having the first thickness; and applying a second different voltage to the gate electrode over the gate oxide having the second thickness.

14. The method of claim 13 wherein the first voltage is greater than the second voltage.

* * * * *